United States Patent
Garnier et al.

(10) Patent No.: US 6,994,314 B2
(45) Date of Patent: Feb. 7, 2006

(54) VALVES ACTIVATED BY ELECTRICALLY ACTIVE POLYMERS OR BY SHAPE-MEMORY MATERIALS, DEVICE CONTAINING SAME AND METHOD FOR USING SAME

(75) Inventors: Francis Garnier, Champigny sur Marne (FR); Bernard Mandrand, Villeurbanne (FR); Patrick Broyer, Villeurbanne (FR); Pierre Imbaud, Pommiers (FR)

(73) Assignee: Biomerieux S. A., Marcy l'Etoile (FR)

( * ) Notice: Subject to any disclaimer, the term of this patent is extended or adjusted under 35 U.S.C. 154(b) by 91 days.

(21) Appl. No.: 10/433,261

(22) PCT Filed: Nov. 30, 2001

(86) PCT No.: PCT/FR01/03783

§ 371 (c)(1),
(2), (4) Date: Nov. 25, 2003

(87) PCT Pub. No.: WO02/44566

PCT Pub. Date: Jun. 6, 2002

(65) Prior Publication Data

US 2004/0108479 A1    Jun. 10, 2004

(30) Foreign Application Priority Data

Dec. 1, 2000    (FR) .................................. 00 15550

(51) Int. Cl.
*F16K 31/02*    (2006.01)

(52) U.S. Cl. .................................. 251/129.6; 251/237

(58) Field of Classification Search ........... 251/129.01, 251/129.06, 129.11, 237
See application file for complete search history.

(56) References Cited

U.S. PATENT DOCUMENTS

| | | | | |
|---|---|---|---|---|
| 4,673,657 A | * | 6/1987 | Christian | 436/501 |
| 5,325,880 A | * | 7/1994 | Johnson et al. | 137/1 |
| 5,975,485 A | * | 11/1999 | Tsai et al. | 251/11 |
| 6,033,191 A | | 3/2000 | Kamper et al. | 417/322 |
| 6,406,605 B1 | * | 6/2002 | Moles | 204/601 |

FOREIGN PATENT DOCUMENTS

| | | |
|---|---|---|
| FR | 27 95 476 | 12/2000 |
| WO | WO 97/22825 | 6/1997 |
| WO | WO 97/27324 | 7/1997 |
| WO | WO 97/33094 | 9/1997 |

* cited by examiner

*Primary Examiner*—Edward K. Look
*Assistant Examiner*—John K. Fristoe, Jr.
(74) *Attorney, Agent, or Firm*—James C. Lydon

(57) ABSTRACT

This invention concerns a valve (2), with at least one channel (3) running through it, allowing a fluid (F3) to be directed by transfer means within a device (1), the device (1) featuring at least one face (4), possibly flat, the valve (2) consisting of a film (7 or 16), flexible and/or which can be deformed, fixed on all or part of the face (4) of said device (1), and a film actuator (7), which enables said valve (2) to be activated or deactivated, this actuator consisting of an electrical power source.

It also consists of a test sample card (1) equipped with at least one valve (2), and a process for actuating the valve (2), as described above.

The invention is particularly applicable in the field of diagnosis.

11 Claims, 5 Drawing Sheets

Coupe A-A

Coupe B-B

VALVES ACTIVATED BY ELECTRICALLY ACTIVE POLYMERS OR BY SHAPE-MEMORY MATERIALS, DEVICE CONTAINING SAME AND METHOD FOR USING SAME

This application is a U.S. National Stage of International Application PCT/FR01/03783, filed Nov. 30, 2001 and published on Jun. 6, 2002 in the French Language.

DESCRIPTION

This invention concerns the field of micromanipulations of fluids wherein valves are used to direct at least one fluid displaced by transfer systems within a test sample card.

Up until now, most test sample cards have recesses on both of their plane and parallel faces as well as crosswise recesses, all of the recesses forming a channel network in which one or more fluids are displaced. On the face of the cards, said recesses are marked out by adhesive films. Fluid displacement is controlled by valves.

This type of structure is not reusable, as a valve can only be used efficiently once. Thus, when the valve is tipped into closed position, the adhesive surface of the film also comes into contact with the rest of the card, and the valve can therefore no longer be used. The valve remains in closed position.

The only solution to this problem thus consists in depositing an inert non-adhesive layer onto an adhesive film, this inert layer being initially made by means of cut-outs, for example by using a punch, and positioned accurately in relation to the adhesive film.

Technically speaking, this is not easy to achieve. In addition, the cost of manufacturing such complex film as well as the difficulties encountered in positioning the film on the test sample card are incompatible with mass production.

Patent application WO-A-00/13795, filed by the applicant, describes an invention on a device or test sample card inside which a reaction or at least two parallel or series reactions can be carried out. The device consists of a network of channels wherein the transfer of at least one sample to be treated and/or analyzed is possible, on the one hand, and at least one valve built into the device, on the other hand, enabling the orientation of each sample transferred at the network level and thus the control of transfers, reactions and analyses in said device. In the embodiment shown in FIGS. 1 through 3, it can be seen that an elastomer disk is inserted between the adhesive film and the body of the card, which allows the valve to be reused.

This structure thus provides a solution, although it increases the number of elements and the manufacturing cost of a functional test sample card.

Document WO-A-97/27324 attempts to provide a solution to this problem. Thus, it concerns a cassette to conduct reactions in parallel which features an entry and exit orifice to transfer the sample(s) to be introduced into the cassette. Valves are present at cassette level, which have a particular construction (Bursapak chamber, piston valve, bead valve). Under a continuous outside force, these valves allow a channel to be held closed. In this embodiment, the film is heat-sealed to the cassette.

However, this construction has a major disadvantage. The disadvantage resides in the deformation of the face of the cassette onto which the film is heat-sealed. While this face is originally plane, the heat-sealing weld causes distortion which is detrimental to subsequent proper use of the cassette. This could range from an error in manipulation and/or analysis to rendering the valves inoperable. The worst problems may be encountered when this type of cassette is used by an automated controller, which is generally the case. In this configuration, the card, which is warped by the heat-seal, may block or even damage the automated controller assembly.

Another disadvantage of this innovation is that it is absolutely necessary that the film is precisely heat-sealed onto the card. Even a tiny error may lead to channel blockage and/or valve leakage.

The applicant also filed a patent application PCT/FR00/1719, filed under priority Jun. 22, 1999, which provides a practical response to all of the disadvantages of prior art described above. Thus, the film is heat-sealed onto the body of the test sample card without damaging the surface where the heat-seal is made. Furthermore, the tolerance for the heat-sealing position is greater, as it only outlines the area that makes up the valve and does not follow it closely. This invention concerns a valve, with at least one channel running through it, allowing at least one fluid displaced by transfer means within a test sample card, the card featuring two faces connected to one another by an edge, characterized in that it consists of a film, which is flexible and/or which can be deformed, secured partly on at least one of the faces of said card, and a film compression means which can be activated or deactivated. The film is secured to at least one of the plane faces by fixing means located at the level of a recession peripheral to the valve, such as a groove. In addition, fixation is carried out by a heat seal peripheral to the valve in the bottom of the groove.

However, the flexible films used in prior art are inert, i.e. they only have structural deformations when subjected to physical stresses. The succession of these stresses, as well as their intensity, may induce constant deformation, which could lead to definitive closing or opening. In addition, these openings and/or closings by deformation require a mechanism to actuate the movement of flexible films, which is bulky, complicated and costly.

Films exist which are not inert. Such films are intrinsic conducting polymers, which will be defined in more detail below. The use of such films as actuators is also known as shown by the following patent applications:

WO-A-99/07997 concerning a rotary motor driven by a conducting polymer,

EP-A-0.735.518 which describes a Braille module featuring an actuator which contains a polymer with intrinsic electrical conductivity, and WO-A-98/35529 featuring a sonic actuator with elastomer dielectric polymer film.

Patent application WO-A-97/22825 describes a microfluid device designed to deliver or not deliver a liquid or gas contained in a pocket via a conduit (48). The opening or closing of the conduit, the partitions of which are flexible, is carried out by a valve using a piezo-electric actuator which can close or open the conduit by means of a metal strip. The valve is opened or closed according to the electric power applied to the actuator. Likewise, U.S. Pat. No. 6,033,191 concerns a pump and not actually a valve. In addition, this pump features a piezo-electric actuator which is superimposed on the pump membrane and even secured by means of a conductive bonding agent.

In contrast to this invention, where the actuator is only the electrical current that will directly deform the film, the actuator according to prior art, constituted by the two previous documents, is made of two parts, which undergo either directly, for the piezo-electric part, or indirectly, for the metal strip, the electric potential, these two parts being independent from the partition which, as for it, is always deformed under the indirect action of the electrical current.

In accordance with this invention, the use of conducting polymers, also known as electroactive polymers, which are very different from those mentioned above, is foreseen. They are used to make valves and, more specifically, minivalves, which are normally open or closed and which close or open, respectively, when electrical current is applied to them. This mechanism considerably simplifies their design and operation.

Such polymers are already known, but their use is currently limited to fundamental research. The use of these materials in valves on small test sample cards is thus of special interest and not obvious.

In relation to mechanically- or pneumatically-controlled valves, valves controlled by electroactive polymers or shape-memory materials have the following advantages:

a reduction in the instrumentation associated with valve addressing, miniaturization is facilitated: a valve can be one micrometer ($\mu$m) in size, and thereby a larger density of valves can be obtained, which enables more complex biological protocols to be managed, with more steps for example, and association of at least two valves along the same channel, which, through rigorous control of their opening and closing, may enable a micro-pump to be created.

Within the scope of the micro-pump, there is a need to perfectly synchronize the opening and closing of both valves concerned, which can be performed electrically, although much more difficult mechanically, particularly with dimensions in the order of a few micrometers.

To that end, this invention concerns a valve with at least one channel running through it, allowing a fluid to be directed by transfer means within a device, the device featuring at least one face, possibly flat, the valve consisting of a film which is flexible and/or can be deformed, fixed on all or part of the face of said device, and a film actuator, which enables said valve to be activated or deactivated, this actuator consisting of an electrical current source.

Preferably, the device is a test sample card with two faces, possibly flat and connected to one another by an edge, the valve consisting of a film which is flexible and/or can be deformed, fixed on all or part of at least one of the faces.

Preferably, the actuator acts directly on an electroactive polymer or on a shape memory material.

According to a first alternate embodiment, the film consists of at least one layer of electroactive polymer allowing the valve to be activated or deactivated directly.

According to this first variant, a first embodiment is represented by the film which consists of a layer of electroactive polymer associated with one porous membrane coated on the other of its faces with a metallic layer of gold or silver, the electroactive polymer forming the positive electrode or the negative electrode and the metal layer forming the actuator's opposite polarity electrode or the electrical power source.

According to this first variant, a second embodiment is represented by the film which consists of a layer of electroactive polymer associated with one porous membrane coated on the other of its faces with a metallic layer of gold or silver, the electroactive polymer forming the positive electrode or the negative electrode and the metal layer forming the actuator's opposite polarity electrode or the electrical power source.

In these two embodiments, a layer of electroactive polymer consists of polyaniline and/or polypyrrole and/or polythiophene and/or polyparaphenylvylene and/or poly-(p-pyridyl vinylene), possibly associated with polyethylene.

Still regarding these two embodiments, the porous layer is any material or mix of materials whose porosity allows ions to pass through it, such as Teflon, polyamide, cellulose, polyaceate and/or polycarbonate.

According to a second alternate embodiment, a control mechanism is present between the film and the actuator.

According to this second variant, the control mechanism consists in whole or in part of an electroactive polymer as defined above, or of a shape memory material, enabling the valve to be activated or deactivated indirectly.

When using an electroactive polymer, the electroactive polymer consists of a longitudinal strip of at least one layer of electroactive polymer. When using a shape memory material, it consists of a complex alloy whose structure changes according to the temperature, such as a nickel and titanium alloy.

In addition, according to the second alternate embodiment, the shape memory material cooperates with a rocking lever to form all or part of the control mechanism.

More specifically, the rocking lever consists of a flexible part and a rigid part, the rigid part cooperating with a valve compression means, the shape memory material, the lever and the compression means together forming the control mechanism.

This invention also concerns a test sample card containing at least one valve, such as described above.

The invention finally proposes a valve actuating process, as described above, which consists in:

applying an electric current to an electroactive polymer film or wire, or to a shape memory metal in rest position, the valve being in open (or closed) position, maintaining the current to hold the film or wire in active position corresponding to a direct or indirect action on the valve in closed (or open) position, and stopping the current so that said film or wire returns to rest position and said valve returns to open (or closed) position.

The accompanying drawings are given by way of example and are not to be taken as limiting in any way. They are designed to make the invention easier to understand.

Figure 14:
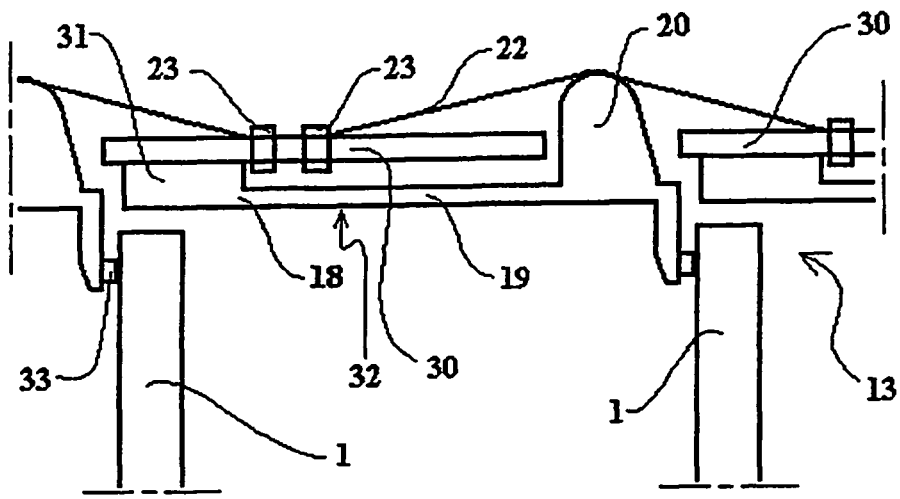
FIG. 14 represents a view similar to FIG. 12, although in which all the visible valves in closed position are directly closed by the rocking lever.
Figure 15:
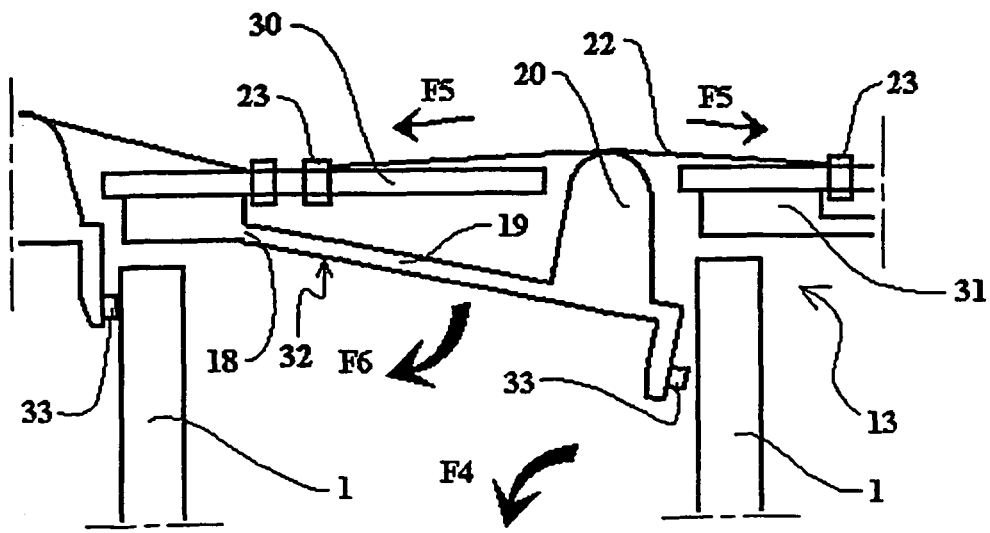

Finally, FIG. 15 represents a view identical to FIG. 14, in which only one of the visible valves is in open position.

The Test Sample Card According to the Invention

A test sample card 1 according to the invention is a combination of functions featuring fluid management (micro-fluids), chemical and/or biochemical reactions, separation of species present in the fluid and detection of these species, grouped together on the same support measuring just a few square centimeters ($cm^2$) in size. These systems can be used to automatically and autonomously perform all the functions of the entire traditional chemical and/or biochemical analysis process by handling only very small quantities of reagent, between a few microliters and a few nanoliters.

The most routinely encountered functions for this type of test sample card 1 are represented in table 1 below. This list is in no way comprehensive.

TABLE 1

Main functions used on the test sample cards according to the invention

| Fluid management | Reaction | Separation | Detection |
| --- | --- | --- | --- |
| Electrophoresis | Mixing | Electrophoresis | Electrochemistry |
| Electroosmosis | Incubation | Electroosmosis | Spectroscopy |
| Micropumping | Heating | Chromatography | |
| Microvalve | | | |
| Sensor | | | |

Silicon, polymers, quartz and glass can be used to make these test sample cards. Conducting polymers and electroactive polymers, defined below, are suitable for numerous other functions.

This invention concerns a reaction card 1 which consists of a rectangular parallelepiped featuring a front surface 4 and a rear surface 5 connected together by an edge, also referred to as the side 6. All of the elements which form the front surface 4 are represented in solid lines in FIG. 1. In addition, a certain number of through channels 3 can be noted on this surface 4. These channels 3 are partitioned by a transparent film 7, affixed on said front surface 4. Nonetheless, it is not mandatory that this film 7 be transparent, as those which will be described below; it may be opaque, translucent, etc. In addition, the transparent nature allows better viewing of the position of the biological solution being tested, or any other solution introduced into the card 1. The rear surface 5 also features a transparent film 21 which partitions the channels 3 shown as dotted lines, because they are flush with this rear face 5 in some locations. This film 21 is very similar to that represented on the front face 4 of FIGS. 10 and 11, which forms another embodiment, and bears the reference 16. These films 16 and 21 consist of BOPP (Biaxially Oriented PolyPropylene) films or other films of the same type, which are soldered or bonded to the body of the card 1, this body being inert in relation to the solutions transferred or to the reactions undergone. The nature of the film 7 however is rather special as it is made of an electroactive polymer. It will be discussed in further detail later on.

Each film 7, 16 or 21 may be present on the entire surface of the card 1. This is the case for films 16 and 21, or on certain portions of said card 1, as for the film 7. Nevertheless, the film 21 may be missing. In this case it is replaced by a partition made with the same material as the rest of the body of the card 1.

Figure 10:
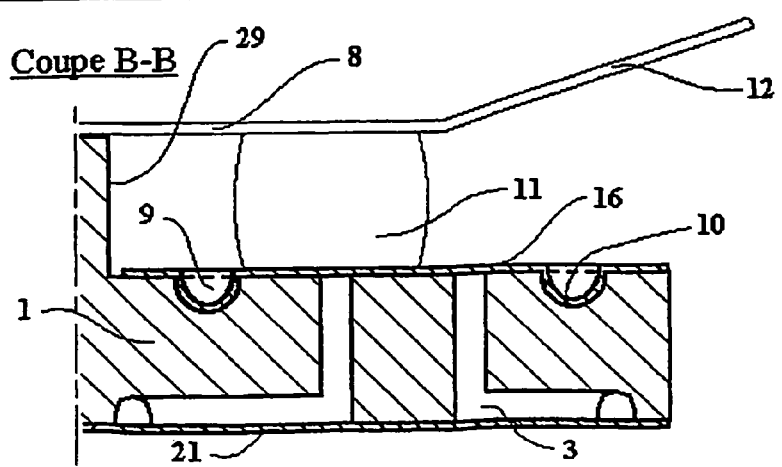
FIG. 10 represents a cross-sectional view along B-B of FIG. 9, when the valve is in closed position.
Figure 11:
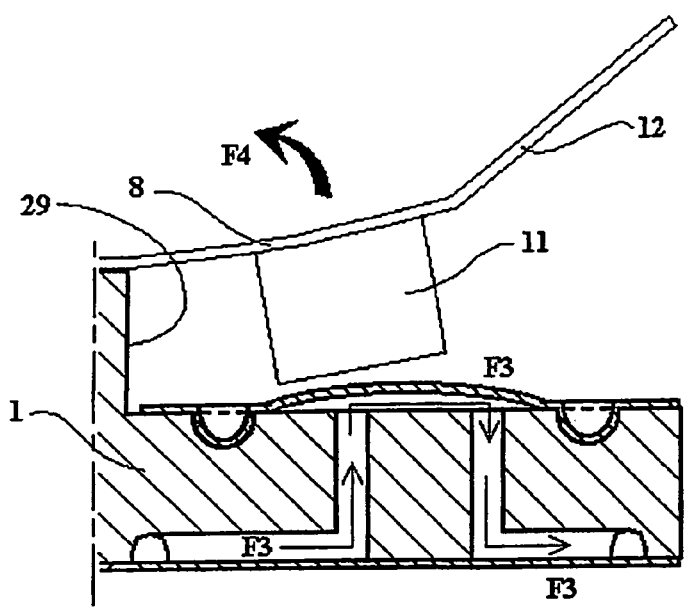
FIG. 11 represents a cross-sectional view identical to FIG. 10, when the valve is in open position.

The film 16 defines the outer face of the valves 2 according to the embodiment shown in FIGS. 10 and 11. This film 16 is thus sufficiently flexible to allow a test liquid, a treated liquid, a wash solution, or an elution liquid, etc. to pass through it. It may consist of a silicone, latex or elastomer membrane, for example Santopren (registered trademark), complex two-thickness sandwich films, such as a combination made of PE/PET (PolyEthylene/PolyEthylene Tetraphtalate) for example, or complex sandwich films with more than two layers, such as a combination made of SEBS/SBS (Styrene Ethylene/Butylene Styrene/Styrene Butylene Styrene).

In addition, the transparent film 16 located on the front 4, and the transparent film 21 located on the rear face 5, can consist of a single transparent film, which further facilitates the fabrication of such a card 1 which is so equipped.

A test sample card 1, according to the invention, generally features dozens of valves 2, as is the case for example in patent applications PCT/FR00/01718, filed under priority Jun. 22, 1999, and FR00/10978 of Aug. 28, 2000, filed by the applicant. An example of fluid movements (F1 in FIG. 1) inside the channel network 3 or (F3 in FIGS. 3, 4, 7 and 11) on the valves 2 are clearly disclosed in patent application FR00/10978.

These valves 2 are controlled by electronic addressing as will be described below.

Conducting Polymers

For informational purposes, the conducting polymers discussed in the prior art above, may be of three broad types:

extrinsic conducting polymers, which consist of an insulating polymeric matrix to which are added conducting particles, generally carbon black, which ensures the electric conduction of the material; the extrinsic conducting polymers have numerous industrial applications in the fields of packaging (anti-static or anti-electromagnetic), electrical protection and connector technology, ionic conducting polymers, which can be classified among polymers having ionic groups, the polymers swelled with ionic solution and the solid polymer electrolytes; the polymer's conductivity is ensured by the ions present in the material; in industry, ionic conducting polymers are used in polymer electrochemical generators, intrinsic conducting polymers, which present an alternation of single and double bond (conjugated polymer); this special electronic structure is responsible for their conducting properties, the conduction being ensured by the polymer's hydrocarboned chains; certain have electric properties (polyaniline, polypyrrole, polythiophene, polyacetylene) while other have electroluminescent properties (polyphenylene vinylene).

Electroactive Polymers

Electroactive polymers deform when a voltage is applied to them. They can be divided into two families responding to an electric voltage by either a pendulum movement or by a longitudinal movement, as shown in table 2 below.

TABLE 2

The nature of electroactive polymers according to their displacement mode

| Displacement mode | Pendulum | Longitudinal |
|---|---|---|
| Polymer type | Ionic Polymer Metal Composite (IPMC) Dual-layer/Multilayer Polypyrrole, polyaniline | Electrostrictive Piezo-electric Electrostatic Ionic polymer gel |
| Material | Carbon nanotubes, Shape memory alloys . . . | Piezo-electric ceramic . . . |

Products exist in sheet form, such as Nafion (registered trademark), with a thickness of 180 μm, manufactured by DuPont de Nemours in the United States. It is a perfluorosulfate polymer, which is then covered with electrodes. Additional information about this material can be found in the article by S. G. Wax and R. R. Sands, Electroactive Polymer Actuators and Devices. SPIE Vol. 3669, March 1999; 2–10, or in the article by Y. Bar-Cohen, S. Leary, M. Shahinpoor, J. O. Harrison and J. Smith, Electroactive Polymer (EAP) actuators for planetary applications. SPIE Vol. 3669, March 1999; 57–63. Protons are exchanged for mobile cations used in the exchange process, which are generally sodium ($Na^+$) or lithium ($Li^+$). It requires the presence of a solvent to operate and absorbs a large quantity of water. The $SO_3^-$ groups are fixed to the matrix of the membrane.

Electric Addressing

Concerning the problem of electronic addressing of a matrix of n×n electrodes, corresponding to electroactive valves, present on a test sample card, a direct connection or multiplexing technique can be used.

The direct connection is the simplest addressing configuration. Each element of the X/Y matrix is connected by two connecting wires. The support can be either a silicon or polymer of variable size owing to micro-technologies and printed circuit and screen-printing techniques.

The multiplexing technique consists in integrating electronic functions under the electrodes of the matrix (column—line decoder). Depending on the line and column selected, these electronic functions enable a point X/Y to be addressed specifically. Only micro-electronic techniques enable components having electronic functions to be made. This type of addressing configuration, based on integrated circuit technologies, is reserved for small components made only on silicon or glass. Such multiplexing principles are well described in U.S. Pat. No. 5,965,452, for example.

The choice of an addressing configuration depends on the foreseen number of electrodes per $cm^2$. For more than 100 electrodes per $cm^2$, a matrix multiplexed by micro-electronic techniques on silicon or glass is generally used. This technique, owing to its low cost per $cm^2$, must be limited to small components, in the order of a few $mm^2$, and is suitable for making electrically-addressable DNA chips. On the other hand, for lesser densities, the direct connection configuration may be used.

DETAILED DESCRIPTION OF THE INVENTION

FIGS. 1 to 8 represent a first embodiment using an electroactive polymer film 7, which enables the electrical current to act directly on said film 7. These figures show three different construction alternatives, represented in FIGS. 1 to 3 for the first alternate embodiment, in FIGS. 4 to 6 for the second alternate embodiment, and in FIGS. 7 and 8 for the third alternate embodiment, respectively.

FIGS. 9 to 13 represent a second embodiment which uses a normal film 16, i.e. identical to the film 21 located on the back 5 of the card 1, and which allows the electric current source to act directly on said film 16, via an intermediate control mechanism 13. These figures describe a fourth alternate embodiment.

Following this description, reference to the alternate embodiments will be made in relation to the explanations provided above.

This invention concerns a test sample card 1 which is a small machined support, measuring a few square centimeters for example, and which, using a fluid circulation network, enables chemical or biological reactions (mixing, incubation, heating . . . ) to be managed (electrophoresis, pumping, valves, sensors, for example) and enables one or more species present in a fluid to be separated (electrophoresis, chromatography, etc.) or detected (spectroscopic, electrochemical detection . . . ).

1°) First Alternate Embodiment

Figure 1:
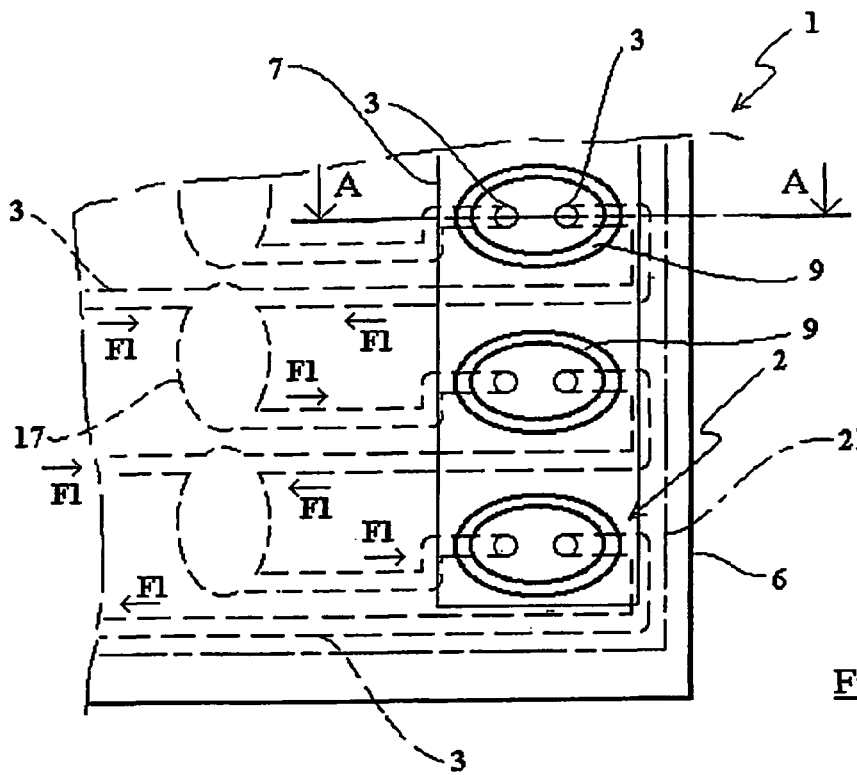
FIG. 1 represents a top view of the test sample card, according to a first embodiment.
Figure 3:
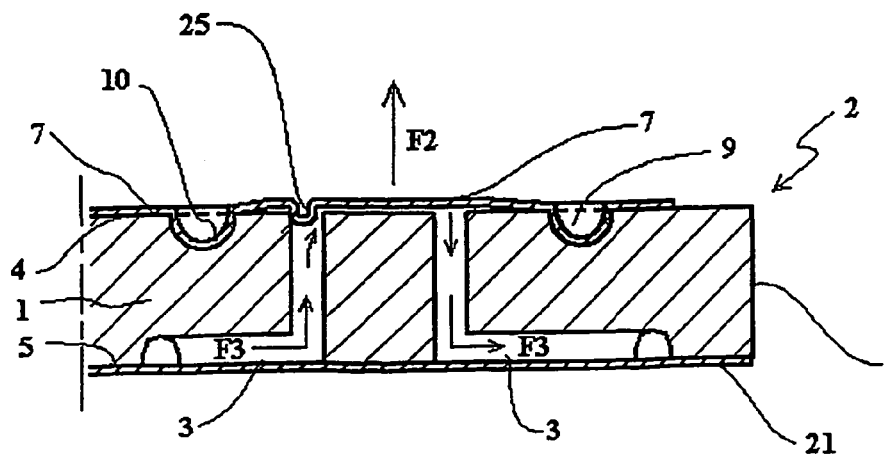
FIG. 3 represents a cross-sectional view identical to FIG. 2, when the valve is in open position.
Figure 4:
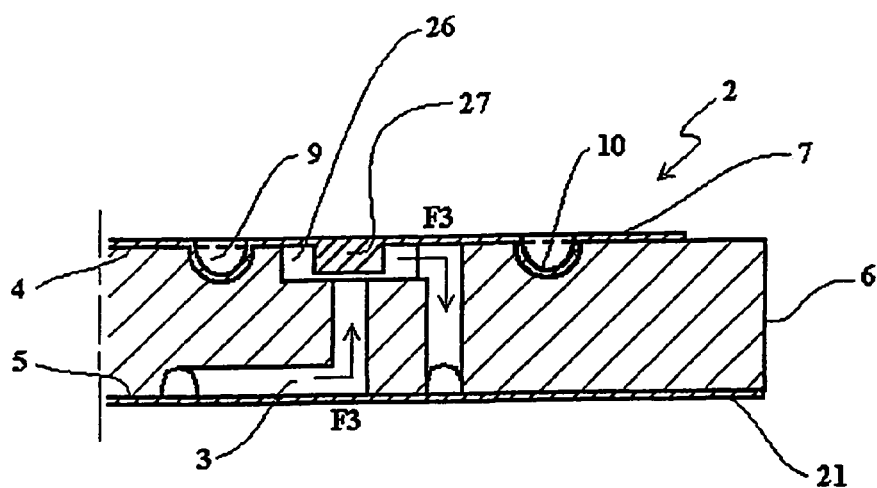
FIG. 4 represents a view similar to FIG. 3, i.e. when the valve is in open position, in a second embodiment.
Figure 5:
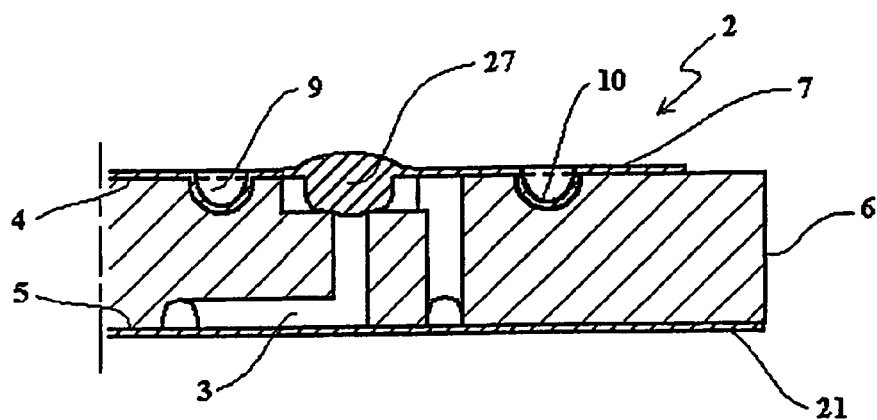
FIG. 5 represents a view identical to FIG. 4, when the valve is in closed position.
Figure 6:
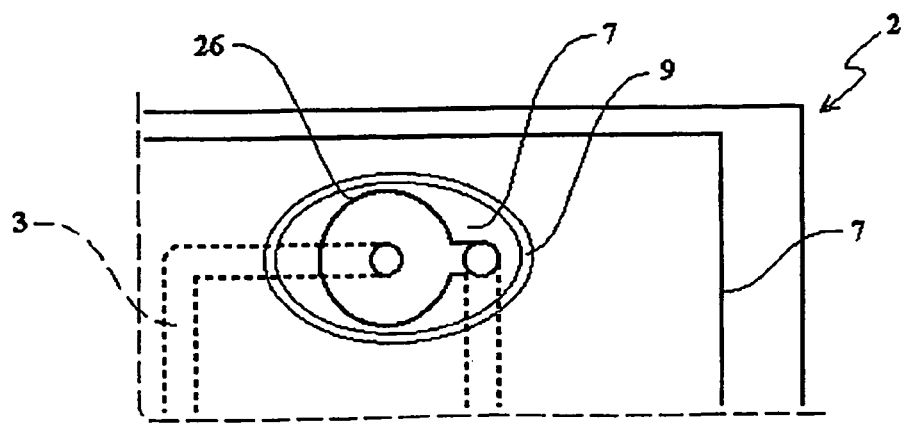
FIG. 6 represents a top view of FIGS. 4 and 5.

FIG. 1 represents a first alternate embodiment which broadly shares the characteristics of FIGS. 4 to 6 described in patent application PCT/FR00/01719 filed by the applicant under priority Jun. 22, 1999, except that in the figures of this invention, there is no flexible tab. In this case, it can be seen that each valve 2 consists of a small flat surface located at the same level as the rest of the flat surface of said card 1 (see also FIGS. 2 and 3). This small flat surface includes at least one inlet channel 3 and one outlet channel 3, the intersection between this surface and the fluid inlet and outlet channels 3 being in contact with the film 7 as is clearly shown in FIG. 2. In this case, the valve is closed. It can be seen from FIG. 2 that the film 7 features an invagination 25, designed to block one of the two channels 3. Of course, invaginations 25 can also block the other channel 3 or both channels 3 of each valve 2. In addition, at the level of valve 2, there may be more channels 3, that is three or more.

It should also be noted that the card features a number of compartments 17. The compartments 17 are connected to the valves by means of channels 3 and it is also possible, although not represented in the figure, that other valves and other compartments are located on the rest of the card 1 which allows mixing between two networks of channels 3 located in parallel and not in series.

Figure 2:
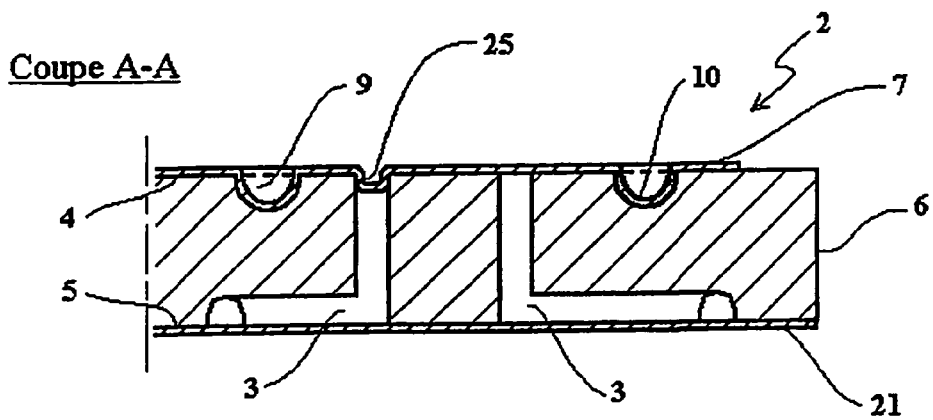
FIG. 2 represents a cross-sectional view along A—A of FIG. 1, when the valve is in closed position.

In FIGS. 2 and 3. it can be seen that, on the upper face 4 of card 1, at least at the level of valve 2, there is a flexible film 7 which is not self-adhesive, as explained in the section dealing with background art. This film 7 is thus heat-sealed in the peripheral groove 9 around the valve 2. This special technique is described here by way of a typical example of an embodiment and is not to be taken as in any way limiting. Furthermore, it is already well-described in patent application PCT/FR00/01719. Nevertheless, on the lower face 5 of said card 1, a self-adhesive film 21, well known in prior art, can be used. Of course, depending on the fact that valves 2 are located on one side or on both sides of card 1, it is also possible that a second flexible film 7 is present on this other side. The upper 4 and lower 5 faces are connected to one another by an edge 6.

The fluid or fluids in the test sample card 1 are displaced in the direction F1 within this card 1 by means of a pressure or vacuum that is created. Deforming the invagination 25 along F2, by applying electric voltage causing the ions to move in the conducting polymer film, authorizes the movement of the fluid at a valve 2, along F3 in FIG. 3. This ion mobility causes the deformation, the contraction or the expansion of the film as a result of the displacement of water molecules. The voltage-current response is typically voltamogramme which features significant hysteresis between the oxidation and the reduction. An example of the evolution of the current depending on the voltage applied may be found, for example, in the article by T. W. Lewis, L. A. P. Kane-Maguire, A. S. Hutchinson, G. M. Spinks and G. G. Wallace, Development of an all-polymer, axial force electrochemical actuator. Synthetic Metals 102 (1999) 1317–1318.

In this manner, the film 7 can be distorted and the fluid can move in the direction of F3 as is clearly displayed. The film 7 must therefore be made of a material that deforms under the action of this electric current and that returns to blocking position according to FIG. 2, as soon as said current is no longer applied.

According to a first construction method, the electroactive polymer forming the film 7 consists of a porous membrane coated on one of its faces with a layer of gold or silver, forming both the positive and negative electrodes of the electric current source.

According to a second construction method, the electroactive polymer consists of a porous membrane with each of its faces coated with a conductive layer, one layer forming the positive electrode and the other layer forming the negative electrode of the electric current source.

This conductive layer consists of polyaniline and/or polypyrrole, two materials which start a pendulum movement when electrically excited.

2°) Second Alternate Embodiment

This variant shares the same components and thus the same references as those of the first variant, namely the valve 2, the channels 3, the faces 4 and 5 of the test sample card 1, the edge 6 of said card 1, the electroactive polymer film 7 on the face 4 of the card 1, the recess or peripheral groove 9 around the valve 2, the peripheral weld 10 in the bottom of the groove 9 and the film 21.

However, the upper face 4 of the card 1 features a recess 26, whose dimensions (namely greater depth and diameter) allow:

the presence of thickening 27 (lesser depth and diameter) of the film 7, and that the two channels 3 used in the valve 2 are open at the level of this recess 26.

When a potential difference is applied, as defined above in the first alternate embodiment, the film 7 will be able to swell and fluid will thus no longer move in the direction of F3 as can be clearly seen in FIG. 5. It is therefore necessary that the film 7 be made of a material that deforms under the action of this electric current and that returns to position to allow the fluid to move in the direction of F3, see FIG. 4, as soon as said current is no longer applied.

It is thus the opposite effect of the first alternate embodiment, when an electric current is applied, the valve 2, according to this first alternate embodiment, is open while the valve 2 is closed according to the second alternate embodiment, and vice versa.

Of course, the recess 26 has a smaller diameter at the flat part circumscribed by the peripheral groove 9.

3°) Third Alternate Embodiment

This third variant shares the same components and thus the same references as those of the first and second variants, namely the valve 2, the channels 3, the faces 4 and 5 of the test sample card 1, the edge 6 of said card 1, the electroactive polymer film 7 borne by the face 4 of the card 1, the peripheral groove 9 around the valve 2, the peripheral weld 10 in the bottom of the groove 9 and the film 21.

However, the upper face 4 of the card 1 features an internal space 28, which is big enough so that the two channels 3 used in the valve 2 open at the level of this internal space 28.

Figure 8:
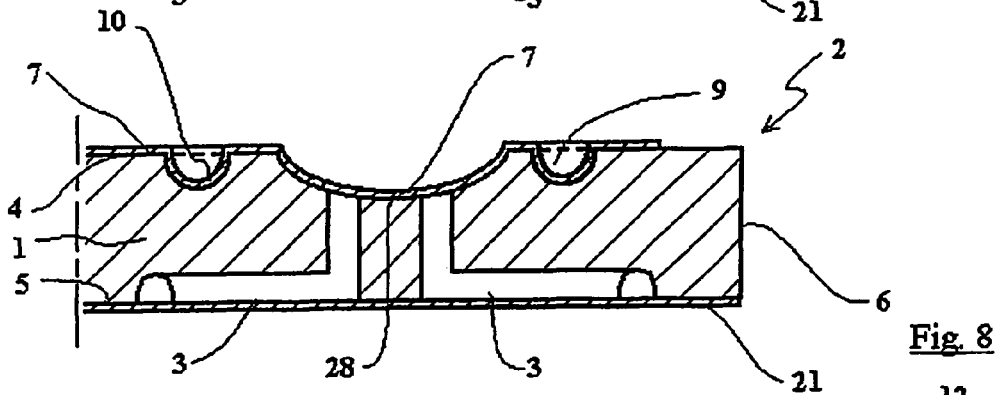
FIG. 8 represents a view identical to FIG. 7, when the valve is in closed position.

When a potential difference is applied as defined above in the first and second alternate embodiments, the film 7 can be distorted and fit the shape of the internal space 28, which will prevent the fluid from moving in the direction of F3 as can be clearly seen in FIG. 8. It is therefore necessary that the film 7 be made of a material which is identical to the first two alternate embodiments described above.

Figure 7:
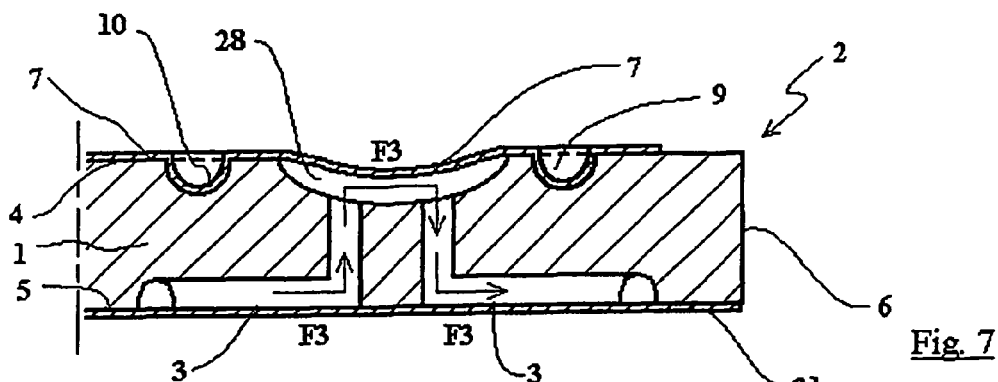
FIG. 7 represents a view similar to FIGS. 3 and 4, i.e. when the valve is in open position, in a third embodiment.

As soon as this electric current action stops, the film 7 returns to its initial position, according to FIG. 7 and thus allows the fluid to flow in the direction of F3.

Of course, the reverse phenomenon is possible, that is that the electroactive polymer 7 closes the valve 2 at rest, and opens said valve 2 as soon as current is applied.

4°) Fourth Alternate Embodiment

Figure 9:
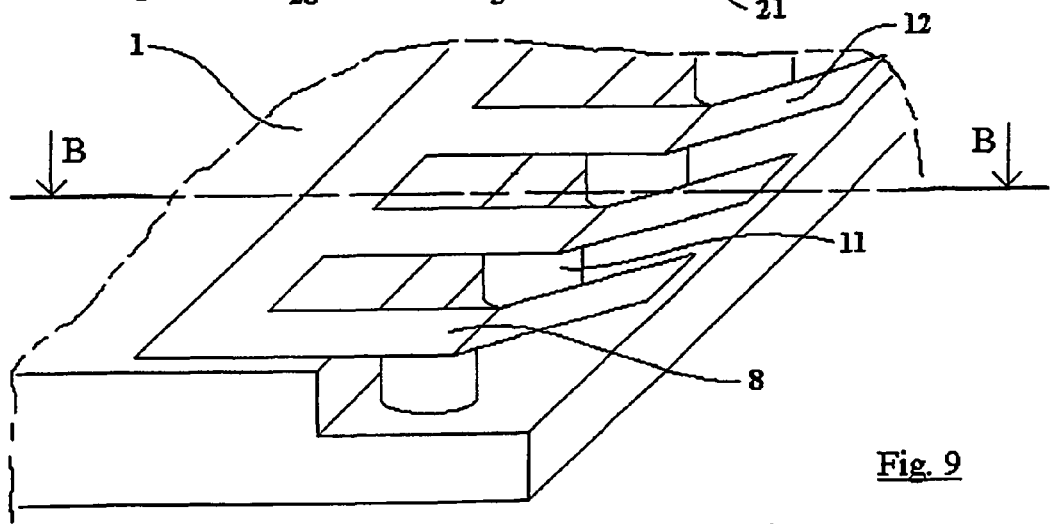
FIG. 9 represents a perspective view of a test sample card according to a fourth embodiment of the invention.

FIG. 9 represents a card 1 which is different from the previous cards even if it maintains the same reference. In this manner, this card stands out by the absence of the electroactive polymer film 7 which is replaced by a film 16, clearly shown in FIGS. 10 and 11, and whose characteristics are essentially mechanical, as mentioned above.

This fourth variant concerns a reaction card 1 which, like its predecessors, consists of a rectangular parallelepiped featuring a front face 4 and a rear face 5 connected together by an edge with a shoulder 29.

A valve 2 is shown in greater detail in FIGS. 10 and 11. It can be noted that at rest, the valve 2 is closed, as the film 16 is against the face where the channels 3, which form said valve 2, come out. The closed position is made possible by the presence of a compression means or tab 8, fixed on the face 4 of the card 1 by part of its surface, the other part overhanging said valve 2. In order to ensure contact and perfect seal of the valve 2, an elastomer pin 11 borne by the tab 8 ensures the connection at rest between said tab 8 and the film 16.

It can also be seen that there is a beveled face 12 at the free end of the tab 8 which facilitates opening of said valve 2. This beveled face 12 is designed to allow said tab 8 to tip, in the direction of F4 in FIG. 11, driven by an outside element, discussed below.

The manner in which this valve 2 operates is thus different from the three previous variants, as the electric current has no direct action on the film 16. If only the card 1 is observed, only the presence or the absence of the tab 8, by means of its elastomer pin 11, allows the closing and opening of said valve 2 respectively.

Figure 12:
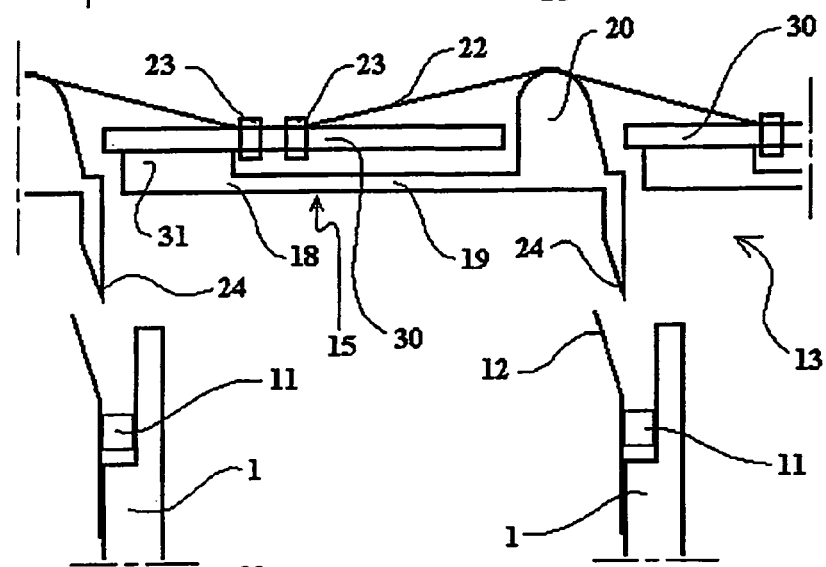
FIG. 12 represents a top view of a set of test sample cards, in a partial view, according to FIGS. 10 and 11, in which all the visible valves are in closed position.
Figure 13:
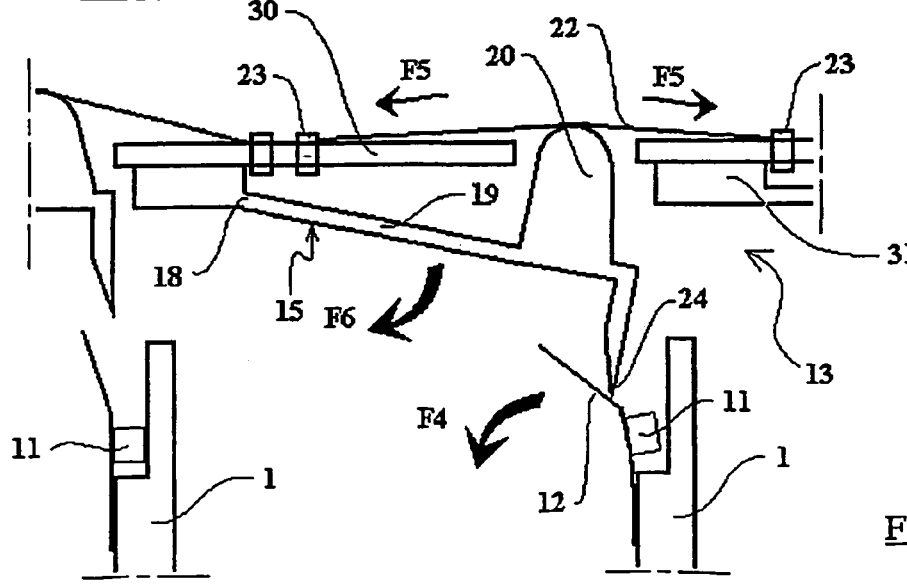
FIG. 13 represents a view identical to FIG. 12, in which only one of the visible valves is in open position.

The outside element implemented to allow the tab 8 to move in the direction of F4 is represented in FIGS. 12 and 13. It is a control mechanism 13 borne by the chassis 30 of an automated analysis apparatus, not shown in the figures. This chassis 30 includes at least one lever 15 consisting of several parts:

a base 31 to secure it to said chassis 30, a flexible part 18, forming an articulation axis with the next part 19, a rigid part 19 to transmit the tipping movement along F6, a bearing boss 20, the function of which will be explained later on, and an end 24, possibly beveled, which acts on the tab 8 (movement in the direction of F4) and more specifically on the beveled face 12 of this tab 8.

This tipping along F6 is clearly shown in FIG. 13. It is produced by a wire made of shape memory material 22, with both ends in contact with a connecting terminal 23 enabling addressing. In this manner, each wire 22 is addressed and electrically positioned via a single transistor, not shown in the figures, directly controlled by the instrument's electronics. For this reason, a voltage in the order of one to a few volts is applied to each connection terminal 23 in series, enabling addressing to take place, which causes the wire(s) 22 to expand. If the wires 22 are in series, applying a voltage to terminal 23 causes all of the wires 22 placed in series to expand. However, if each terminal 23 electrically isolates the two electric wires 22 which are connected to said terminal, the addressing can be carried out in relation with all or part of these wires.

Along a wire 22, another contact exists with the bearing boss 20 which acts as a means of transmission of the shrinking force F5 of said wire 22, to ensure the tipping F6 of the rigid part 19 of the lever 15. Such wires 22 may consist of FLEXINOL wires (registered trademark) made of a complex nickel-titanium alloy purchased from the DYNALLOY Inc. Company (Costa Mesa, Calif., United States of America). At ambient temperature, this wire 22 is easily drawn, although when a sufficient current flows through it, that is approximately 1,000 milliamperes (mA) at 0.3 Volt per centimeter (V/cm), its length decreases 3 to 5% while exerting a traction force of approximately 900 gram-.force (g.force). Nevertheless, this force depends on the diameter of the wire, as can be clearly seen in table 3 below:

TABLE 3

Performance characteristics of shape memory wires in relation to their diameter

| Wire diameter (mm) | Shrinking force (g. force) | Relaxation force (g. force) | Typical current (mA) at 0.3 V/cm |
|---|---|---|---|
| 0.05 | 35 | 8 | 50 |
| 0.10 | 150 | 28 | 180 |
| 0.15 | 330 | 62 | 400 |
| 0.25 | 930 | 172 | 1000 |
| 0.38 | 2000 | 380 | 2500 |

The response times allow 13 to 65 cycles per minute, for a transition temperature of 90° C. The number of cycles shifts from 9 to 40 if this temperature is 70° C. The life cycle of this type of wire 22 is at least one million cycles.

As shown in FIGS. 12 and 13, the automatic analysis apparatus can contain several cards 1 in parallel; these cards 1 could however also be installed in series, or both series and parallel at the same time. In an embodiment of the invention, the distance separating two cards 1 in parallel is 25 mm. Similarly, it is possible to have numerous levers 15 above one another, in order to allow several valves 2 located side by side on a card 1 to be opened. The spacing which exists between two adjacent levers 15 working on the same card 1 is generally between 1 and 5 mm. Preferably, this spacing is a value used in the field of electronics, such as 3.96 mm, 2.54 mm or 1.28 mm.

5°) Fifth Alternate Embodiment

FIGS. 14 and 15 represent a card 1 which is different from the previous cards even if it maintains the same reference. In this manner, this card 1 stands out owing to the absence of the electroactive polymer film 7 which is replaced with a film 16, clearly shown in FIGS. 10 and 11, and whose characteristics are essentially mechanical as mentioned above. This fifth variant is a simplified evolution of the fourth variant.

The fundamental difference lies in the fact that the card 1 does not have compression means 8. The card 1 thus has valves which are normally open at rest, while they are normally closed in the fourth variant.

The control mechanism 13 is thus simpler, according to this fifth variant, as the lever 32 acts directly on said card 1; in this manner, the free end of the lever 32, not labeled, is equipped with an elastomer hermetic closing means or compression pin 33. This pin compresses the film 16 when the wire made of shape memory material 22, already described in the previous variant, is not energized.

It is also possible to foresee that the wire 22 is replaced by a longitudinal strip made of electroactive polymer, according to the first three alternate embodiments.

REFERENCES

1. Test sample card or device
2. Valve
3. Channel
4 and 5. Faces of the card (1)
6. Edge of the card (1)
7. Electroactive polymer film on the face 4 of the card 1
8. Compression means of the film 7 or flexible tab
9. Recession or groove peripheral to the valve 2
10. Peripheral weld located in the bottom of the groove 9
11. Elastomer hermetic closing means or compression pin borne by the means or tab 8
12. Opening means or bevel borne by the means or tab 8
13. Control mechanism
14. Shape memory material forming the control mechanism 13
15. Rocking lever forming the control mechanism 13
16. Flexible film and/or which can be deformed, on the face 4 of the card 1
17. Compartment of the card 1
18. Flexible part of the lever 15
19. Rigid part of the lever 15
20. Bearing boss of the lever 15
21. Film on the other face 5 of the card 1
22. Wire made of shape memory material
23. Electric connection terminal for addressing purposes
24. Beveled end of the lever 15 acting on the tab 8
25. Invagination of the film 7
26. Recess on the face 4 of the card 1
27. Thickening 27 of the film 7 at the level of the recess 26
28. Internal space on the face 4 of the card 1
29. Shoulder of the test sample card 1
30. Frame of an automatic analysis apparatus
31. Base 31 of the lever 15 integral with the chassis 30
32. Rocking lever forming the control mechanism 13
33. Elastomer hermetic closing means or compression pin on the lever 32
F1. Fluid movements at the card 1 level
F2. Distortion of the film 7
F3. Fluid transfer at the valve 2 level
F4. Tipping of the tab 8
F5. Shrinking force of the wire made of shape memory material 22
F6. Rocking of the lever 15 driven by the wire made of shape memory material 20

The invention claimed is:
1. A sample card, comprising
first and second opposed surfaces separated from one another by a width of the sample card;
at least one inlet channel having an opening on said first surface, at least one outlet channel having an opening on said first surface, a valve comprising a flexible or deformable film covering said inlet channel opening and said outlet channel opening, such that at least one opening is blocked by said film when said film is in a channel blocking position so that in operation a fluid present in said inlet channel cannot flow through said valve to said outlet channel;

at least one valve actuator adapted to open or close said valve, said valve actuator comprising an electric current source which acts directly on said flexible or deformable film to open said valve by removing said film from said at least one opening, so that in operation said fluid is permitted to flow from said inlet channel to said outlet channel, wherein said flexible or deformable film comprises an electroactive polymer.

2. The test card of claim 1, wherein said first and second surfaces are flat.

3. The test card of claim 1, wherein said flexible or deformable film comprises a layer of electroactive polymer associated with at least one porous membrane coated on the other of its faces with a metallic layer of gold or silver, the electroactive polymer forming the positive electrode or the negative electrode and the metal layer forming an opposite polarity electrode of the electric current source.

4. The test card of claim 3, wherein the porous membrane is any material or mix of materials whose porosity allows ions to pass through it.

5. The test card of claim 4, wherein said porous membrane material is a member of the group consisting of polytetrafluoroethylene, polyamide, cellulose, polyacetate and polycarbonate.

6. The test card of claim 1, wherein said flexible or deformable film comprises a porous membrane with each of its faces coated with an electroactive polymer layer, one layer forming the positive electrode and the other layer forming the negative electrode of the electric current source.

7. The test card of claim 1, wherein said electroactive polymer is at least one member of the group consisting of polyaniline, polypyrrole, polythiophene, polyparaphenylvylene and poly-(p-pyridyl vinylene), said member optionally associated with polyethylene.

8. The test card of claim 1, wherein the electroactive polymer is in the form of a longitudinal strip.

9. The test card of claim 1, wherein said valve further comprises a recess in said first surface, said inlet channel opening and said outlet channel opening both communicating with said recess and said flexible or deformable film covering said recess.

10. The test card of claim 1, further comprising a device for transferring fluid from a first location in the test card to a second location through said fluid inlet channel and said outlet channel via said valve, wherein said device is capable of applying a vacuum or pressure to said fluid.

11. A method f or operating the test card of claim 1, comprising:

applying an electric current to said flexible or deformable film, thereby moving the film from a rest position, in which the valve is in either an open or closed position, to an active position, in which the valve is in a closed or open position, respectively.

maintaining the current to hold said flexible or deformable film in said active position, and stopping the current so that said film returns to said rest position and said valve returns to either the open or closed position, respectively.

* * * * *